United States Patent
Chiang et al.

(10) Patent No.: US 8,431,835 B2
(45) Date of Patent: Apr. 30, 2013

(54) PACKAGING DEVICE FOR AN ELECTRONIC ELEMENT AND METHOD FOR MAKING THE SAME

(75) Inventors: Wen-Chung Chiang, Lujhu Township (TW); Keng-Chung Wu, Lujhu Township (TW); Ying-Chi Hsieh, Lujhu Township (TW); Cheng-Kang Lu, Lujhu Township (TW); Ming-Huang Fu, Lujhu Township (TW)

(73) Assignee: High Conduction Scientific Co. Ltd., Lujhu Township, Taoyuan (TW)

( * ) Notice: Subject to any disclaimer, the term of this patent is extended or adjusted under 35 U.S.C. 154(b) by 329 days.

(21) Appl. No.: 12/720,310

(22) Filed: Mar. 9, 2010

(65) Prior Publication Data

US 2010/0230156 A1    Sep. 16, 2010

(30) Foreign Application Priority Data

Mar. 11, 2009   (TW) .............................. 98107851 A

(51) Int. Cl.
    *H01R 13/502*    (2006.01)
(52) U.S. Cl.
    USPC .................... 174/563; 228/180.1; 29/830
(58) Field of Classification Search ............ 174/563, 174/384, 385; 228/180.1; 29/830
    See application file for complete search history.

(56) References Cited

U.S. PATENT DOCUMENTS

| | | | | |
|---|---|---|---|---|
| 3,538,597 A * | 11/1970 | Shimkus et al. | ............. | 228/164 |
| 4,709,122 A * | 11/1987 | Samuels | ..................... | 174/50.5 |
| 4,754,101 A * | 6/1988 | Stickney et al. | ............. | 174/383 |
| 4,769,272 A * | 9/1988 | Byrne et al. | ................... | 428/209 |
| 4,827,082 A * | 5/1989 | Horiuchi et al. | ............. | 174/50.5 |
| 4,842,961 A * | 6/1989 | Basile et al. | .................. | 428/672 |
| 4,967,315 A * | 10/1990 | Schelhorn | .................... | 361/818 |
| 5,064,782 A * | 11/1991 | Nishiguchi | ................... | 228/121 |
| 2008/0010820 A1 * | 1/2008 | Birkmeyer et al. | ............. | 29/840 |

\* cited by examiner

*Primary Examiner* — Hung Ngo
(74) *Attorney, Agent, or Firm* — Occhiuti Rohlicek & Tsao LLP

(57) ABSTRACT

A method for making a packaging device for an electronic element includes: preparing a ceramic frame body defined with a hollow space for receiving the electronic element therein; preparing a ceramic substrate having a copper layer formed thereon; etching the copper layer to form a predetermined copper pattern on an upper surface of the ceramic substrate; placing the ceramic frame body onto the upper surface of the ceramic substrate and in contact with the copper pattern; and heating the ceramic frame body and the ceramic substrate such that the copper pattern bonds the ceramic frame body to the ceramic substrate. A packaging device for an electronic element is also disclosed.

15 Claims, 4 Drawing Sheets

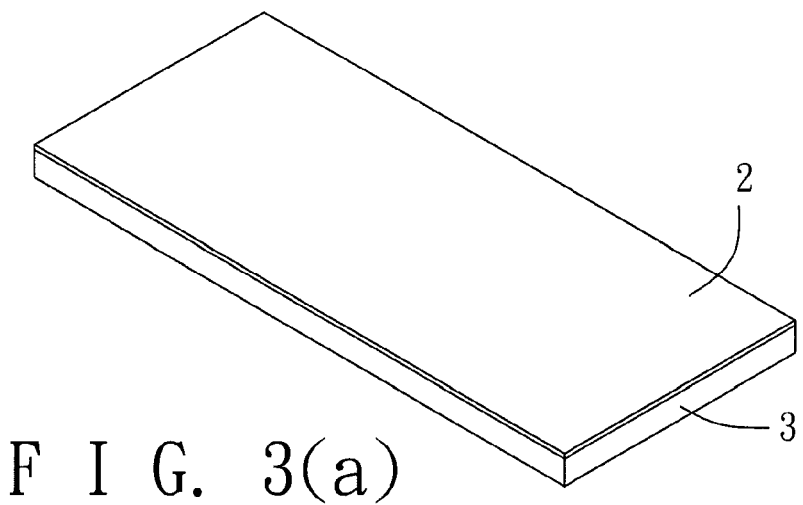
F I G. 3(a)
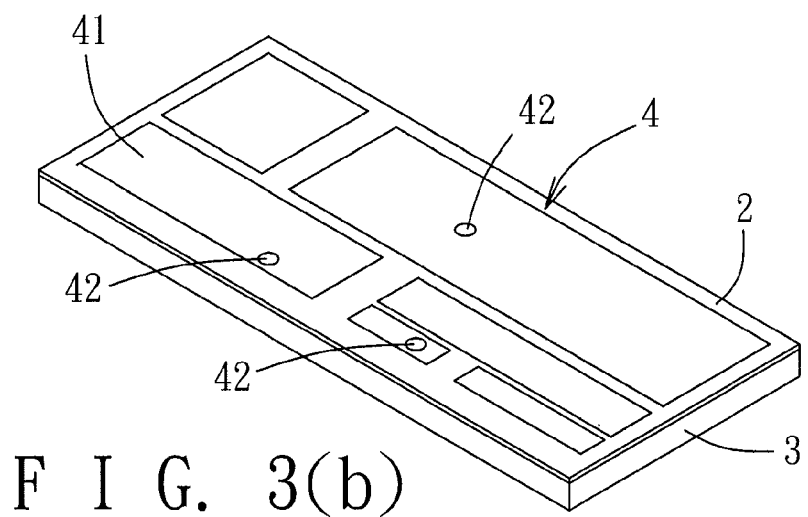
F I G. 3(b)
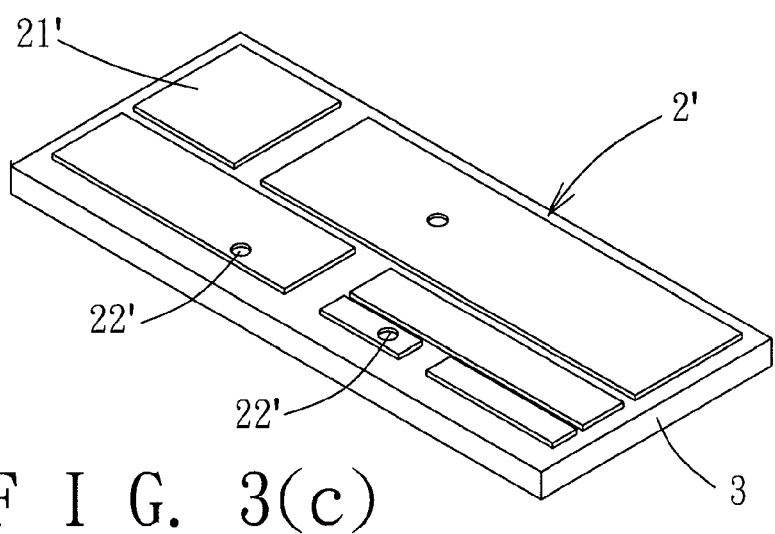
F I G. 3(c)

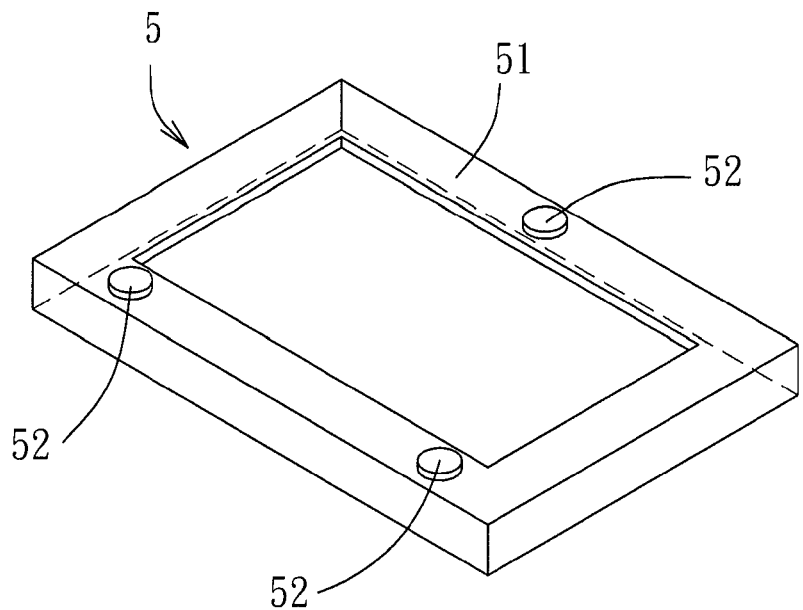
F I G. 4
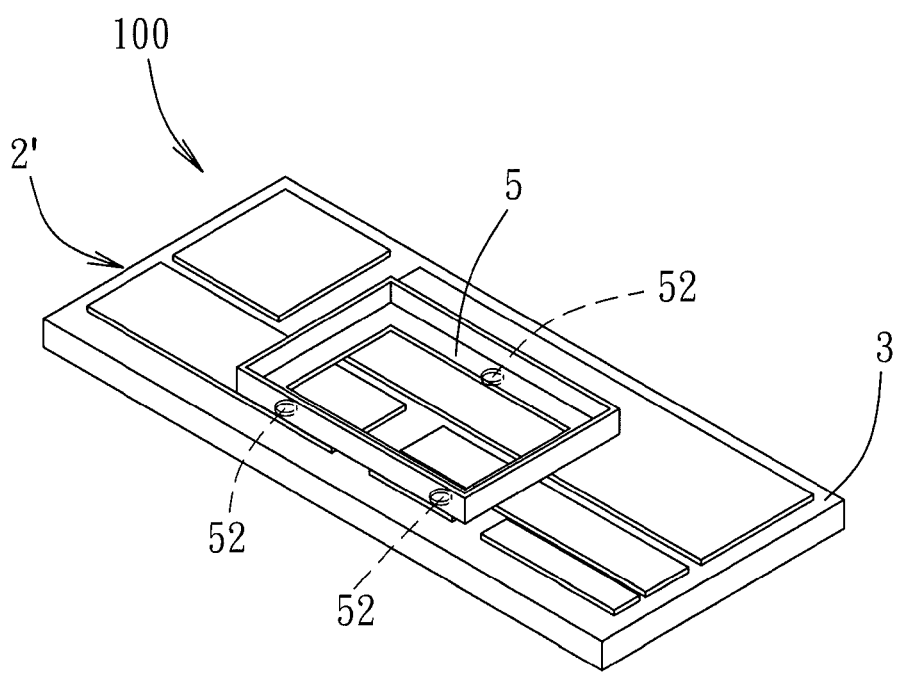
F I G. 5

PACKAGING DEVICE FOR AN ELECTRONIC ELEMENT AND METHOD FOR MAKING THE SAME

CROSS-REFERENCE TO RELATED APPLICATION

This application claims priority of Taiwanese application no. 098107851, filed on Mar. 11, 2009.

BACKGROUND OF THE INVENTION

1. Field of the Invention

This invention relates to a packaging device for an electronic element and a method for making the same.

2. Description of the Related Art

For preventing electrical properties of an electronic element from being worsened due to moisture or pollutants, it is necessary to protect the electronic element, for example, a light emitting diode, by using a package device to prolong a lifetime of the electronic element.

A conventional package device for a light emitting diode is shown in FIG. 1, and includes a substrate 91, a frame body 92 disposed on the substrate 91 and having a space for receiving a semiconductor chip (not shown), and a lens 93 covering the frame body 92 to encapsulate the semiconductor chip inside the package device. The substrate 91 can be a ceramic substrate having a copper pattern formed thereon for electrical connection with the semiconductor chip. The frame body 92 can be made of metal or plastic, and is attached to the substrate 91 using an adhesive.

However, the semiconductor chip will release heat energy during operation, thereby aging and degrading the adhesive or causing the frame body 92 to depart from the substrate 91. Therefore, the encapsulation of the chip is likely to be worsened with time such that the lifetime of the conventional package device is shortened. Besides, when the frame body 92 is made of metal, it is necessary to take measures to insulate the copper pattern on the substrate 91 from the frame body 92, and thus arises in inconvenience when packaging the chip.

SUMMARY OF THE INVENTION

Therefore, an object of the present invention is to provide a packaging device for an electronic element and a method for making the same that can overcome the problems attributed to the aging of an adhesive and to the metal-made frame body.

According to one aspect of this invention, a method for making a packaging device for an electronic element is provided. The method comprises:

preparing a ceramic frame body defined with a hollow space for receiving the electronic element therein;

preparing a ceramic substrate having a copper layer formed thereon;

etching the copper layer to form a predetermined copper pattern on an upper surface of the ceramic substrate;

placing the ceramic frame body onto the upper surface of the ceramic substrate and in contact with the copper pattern; and heating the ceramic frame body and the ceramic substrate such that the copper pattern bonds the ceramic frame body to the ceramic substrate.

Preferably, the step of etching includes forming a wiring region and a positioning element in the copper pattern. The wiring region is for electrical connection with the electronic element. The positioning element is formed in a region where the ceramic frame body is bonded to the copper pattern. The positioning element is a recess, and the ceramic frame body has a protrusion for interference fit with the recess.

Preferably, before the etching step, the method further comprises: coating a photosensitive layer on the copper layer; and exposing and developing the photosensitive layer to define the copper pattern.

Since the wiring region and the positioning element are formed at the same step, and since the step of placing the ceramic frame body on the ceramic substrate can be conducted more easily with the use of the positioning element, the time and cost for making the packaging device can be reduced.

The step of heating is conducted by direct bonding copper (DBC) or direct copper bonding (DCB) at a temperature that is lower than the melting point of copper (about 1083° C.) and higher than the eutectic temperature of the copper-copper oxide eutectic (1063° C.). Therefore, the copper pattern bonds the ceramic frame body to the ceramic substrate. The copper pattern has a copper oxide layer formed thereon.

According to another aspect of this invention, a packaging device for an electronic element is provided. The packaging device comprises:

a ceramic substrate;

a copper layer having a predetermined copper pattern formed on an upper surface of the ceramic substrate; and a ceramic frame body bonded directly to the copper pattern on the ceramic substrate and defined with a hollow space for receiving the electronic element therein.

Preferably, the copper pattern has a region provided with a positioning element, and the ceramic frame body is bonded to the region. The positioning element is a recess, and the ceramic frame body has a protrusion for interference fit with the recess. Furthermore, the copper pattern has a wiring region for electrical connection with the electronic element.

The ceramic frame body is in a form of a square, a circle, or a polygon, and is made of aluminum oxide, aluminum nitride, or titanium oxide.

By the method and the packaging device according to the present invention, the ceramic frame body is bonded to the ceramic substrate without using an adhesive. The bonding and sealing between the ceramic frame body and the ceramic substrate is firmer than that of the prior art, since no aging of the adhesive would occur. The frame body is made of a ceramic material, and thus, there will be no short-circuit problem occurring between the frame body and the copper pattern on the ceramic substrate.

BRIEF DESCRIPTION OF THE DRAWINGS

Other features and advantages of the present invention will become apparent in the following detailed description of the preferred embodiments of the invention, with reference to the accompanying drawings, in which:

FIGS. 3(a) to 3(c) show consecutive steps of forming a copper pattern on a ceramic substrate according to the method of the present invention;

FIG. 4 is a perspective view of a ceramic frame body according to the present invention; and FIG. 5 is a perspective view of a packaging device for an electronic element according to the present invention.

DETAILED DESCRIPTION OF THE PREFERRED EMBODIMENT

Figure 1:
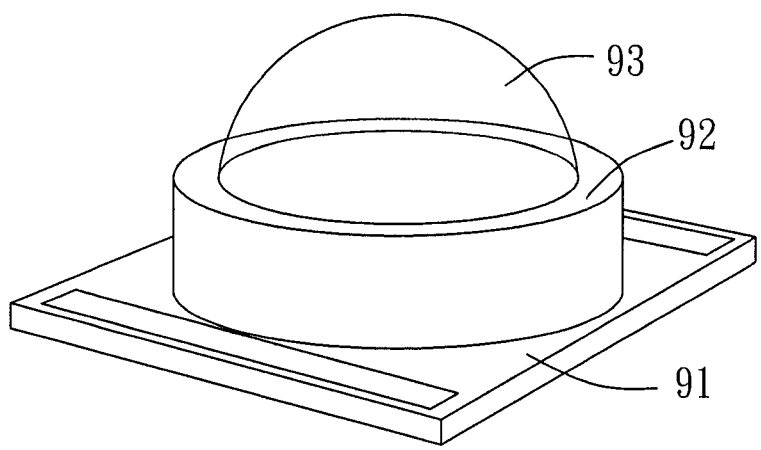
FIG. 1 is a perspective view of a conventional packaging device for a light emitting diode.
Figure 2:
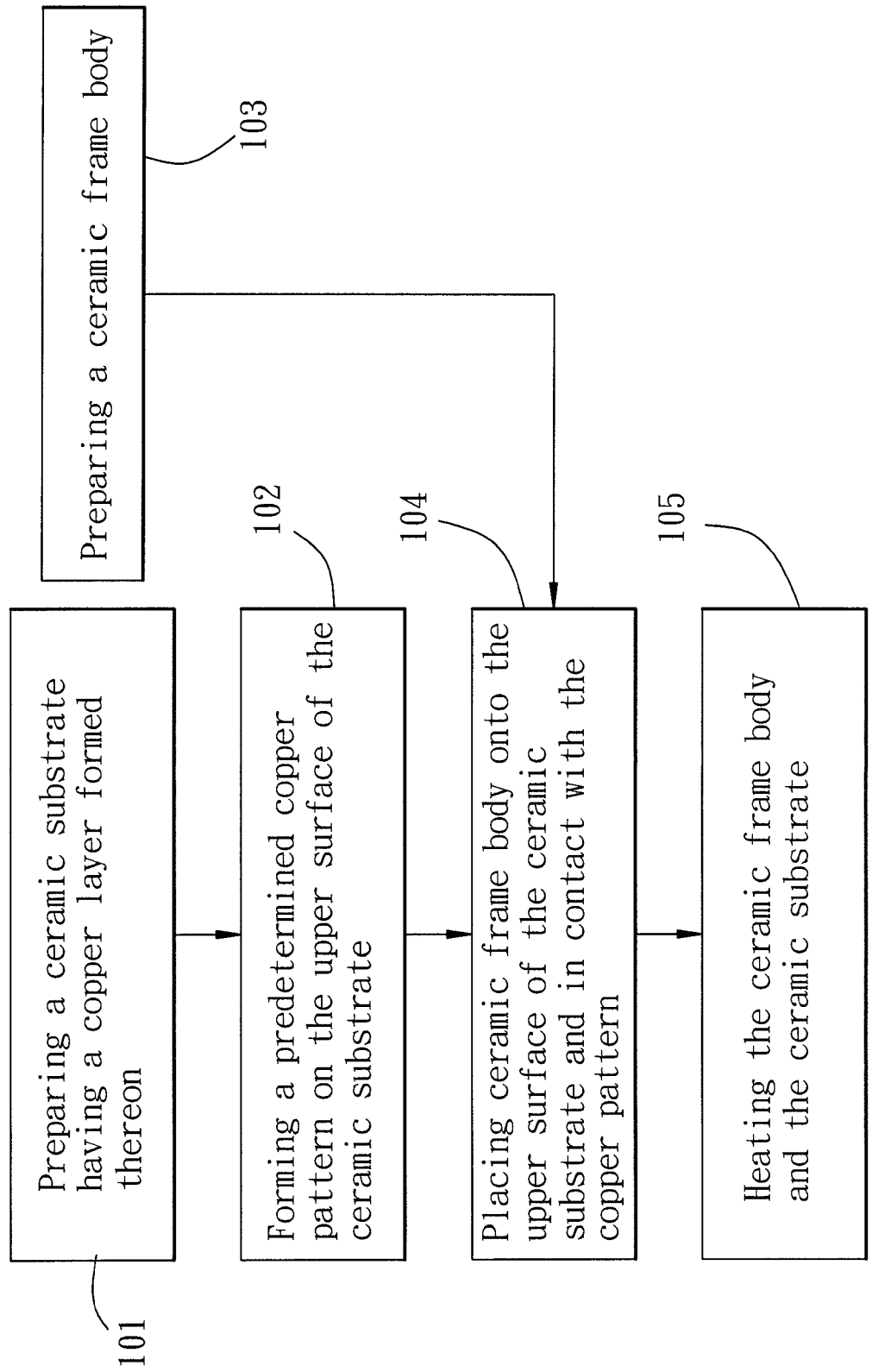
FIG. 2 is a flow chart showing a method for making a packaging device for an electronic element according to the present invention.

The preferred embodiment of the method for making a packaging device 100 for an electronic element (not shown) according to the present invention will be described hereinafter with reference to FIGS. 2 to 5.

In step 101, a ceramic substrate 3 having a copper layer 2 formed thereon is prepared, as shown in FIG. 3(a). In the preferred embodiment, the ceramic substrate 3 is made of aluminum oxide, and the copper layer 2 is bonded to the ceramic substrate 3 using a direct bonding copper method. Although only one copper layer 2 is formed on the ceramic substrate 3 in this embodiment, in other embodiments, two copper layers 2 may be formed respectively on upper and lower surfaces of the ceramic substrate 3.

In step 102, a predetermined copper pattern 2' is formed on the upper surface of the ceramic substrate 3. The step 102 includes the following sub-steps:

(1) coating a photosensitive layer (not shown, only a pattern layer 4 of the photosensitive layer after developing is shown in FIG. 3(b)) on the copper layer 2;

(2) exposing the photosensitive layer using a photomask (not shown) and developing the photosensitive layer to transfer a pattern of the photomask onto the photosensitive layer to form the pattern layer 4 of the photosensitive layer and to define the copper pattern 2', the pattern layer 4 also serving as a protective layer for an etching process;

(3) etching the copper layer 2, which is not covered by the pattern layer 4, till the upper surface of the ceramic substrate 3 is exposed; and (4) removing the pattern layer 4 to form the copper pattern 2'.

In this embodiment, the copper pattern 2' includes a wiring region 21' and three positioning elements 22'. The wiring region 21' is for electrical connection with the electronic element (not shown). In the sub-step of etching, the wiring region 21' is covered by line portions 41 of the pattern layer 4. The positioning elements 22' are recesses formed in the wiring region 21', and thus, are not covered by the line portions 41 and are exposed from the mark portions 42 of the pattern layer 4.

In this embodiment, the positioning elements 22' are formed in a region of the copper pattern 2', and a ceramic frame body 5 is bonded to the region in a following step (see FIG. 5). The positioning elements 22' have no influence on the wiring region 21' and function to provide interference fit with a ceramic frame body 5. The positions and numbers of the positioning elements 22' can be varied based on positions of the ceramic frame body 5 and the wiring region 21', and should not be limited to this embodiment.

In step 103, the ceramic frame body 5 is prepared (see FIG. 4). The ceramic frame body 5 is defined with a hollow space for receiving the electronic element (not shown) therein, and has three protrusions 52 on a bottom surface thereof. The protrusions 52 can be placed in interference with the positioning elements 22' on the ceramic substrate 3 such that the protrusions 52 can be located in the recesses of the respective positioning elements 22'. In this embodiment, the ceramic frame body 5 is in a form of a rectangle and is made of aluminum oxide. The ceramic frame body 5 can also be in a form of a square, a circle, or a polygon based on requirements of the design, and can be made of aluminum nitride, or titanium oxide. It should be noted that the ceramic frame body 5 can be made from any other materials that are suitable for the direct bonding copper process, and should not be limited to this embodiment.

In step 104, the ceramic frame body 5 is placed onto the upper surface of the ceramic substrate 3 and is in contact with the copper pattern 2'. In this step, the ceramic frame body 5 is oriented on the ceramic substrate 3 by placing the protrusions 52 in interference fit with the recesses of the positioning elements 22'.

In step 105, the ceramic frame body 5 and the ceramic substrate 3 are heated, such that the copper pattern 2' bonds the ceramic frame body 5 to the ceramic substrate 3. In the preferred embodiment, after the ceramic frame body 5 is oriented on the ceramic substrate 3, the heating step 105 is conducted in a high temperature furnace at an atmosphere having oxygen content lower than 10 ppm using direct copper bonding (DCB) at a temperature that is lower than the melting point of copper (about 1083° C.) and higher than the eutectic temperature of the copper-copper oxide eutectic (1063° C.). By this step 105, the bottom surface 51 of the ceramic frame body 5 and the copper pattern 2' of the ceramic substrate 3 are eutectic bonded to each other. Accordingly, the packaging device 100 is formed.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for making a packaging device for an electronic element, said method comprising: preparing a ceramic frame body defined with a hollow space for receiving the electronic element therein and having a ceramic peripheral bottom surface; preparing a ceramic substrate having a copper layer formed thereon; etching the copper layer to form a predetermined copper pattern on an upper surface of the ceramic substrate; placing the ceramic frame body onto the upper surface of the ceramic substrate and in contact with the copper pattern; and heating the ceramic frame body and the ceramic substrate such that the copper layer eutectic bonds the ceramic peripheral bottom surface to the ceramic substrate, whereby the copper pattern formed on the ceramic substrate and the ceramic frame body are eutectic bonded to each other without using either one of adhesive and solder.

2. The method of claim 1, wherein the step of etching includes forming a wiring region and a positioning element in the copper pattern, the positioning element being formed in a region where the ceramic frame body is bonded to the copper pattern.

3. The method of claim 2, wherein the positioning element is a recess, and the ceramic frame body has a protrusion for the interference fit with the recess.

4. The method of claim 1, further comprising before the etching step: coating a photosensitive layer on the copper layer; and exposing and developing the photosensitive later to define the copper pattern.

5. A packaging device for an electronic element, said packaging device comprising: a ceramic substrate; a copper layer having a predetermined copper pattern formed on an upper surface of said ceramic substrate; and a ceramic frame body having a ceramic peripheral bottom surface to which said copper layer on said ceramic substrate is eutectic bonded so as to define a hollow space for receiving the electronic element therein, whereby the copper pattern formed on the ceramic substrate and the ceramic frame body are eutectic bonded to each other without using either one of adhesive and solder.

6. The packaging device of claim 5, wherein said copper pattern has a region provided with a positioning element, and said ceramic frame body is bonded to said region.

7. The packaging device of claim 6, wherein said positioning element is a recess, and said ceramic frame body has a protrusion for interference fit with said recess.

8. The packaging device of claim 7, wherein said copper pattern further has a wiring region for electrical connection with the electronic element.

9. The packaging device of claim 5, wherein said ceramic frame body is in the form of a rectangle.

10. The packaging device of claim 5, wherein said ceramic frame body is in the form of a circle.

11. The packaging device of claim 5, wherein said ceramic frame body is in the form of a polygon.

12. The packaging device of claim 5, wherein said ceramic frame body is in the form of a square.

13. The packaging device of claim 5, wherein said ceramic frame body is made of aluminum oxide.

14. The packaging device of claim 5, wherein said ceramic frame body is made of aluminum nitride.

15. The packaging device of claim 5, wherein said ceramic frame body is made of titanium oxide.

\* \* \* \* \*